(12) United States Patent
Sasaki

(10) Patent No.: US 9,202,876 B2
(45) Date of Patent: Dec. 1, 2015

(54) METHOD FOR CONTROLLING CONCENTRATION OF DONOR IN $GA_2O_3$-BASED SINGLE CRYSTAL

(71) Applicant: TAMURA CORPORATION, Tokyo (JP)

(72) Inventor: Kohei Sasaki, Tokyo (JP)

(73) Assignee: TAMURA CORPORATION, Tokyo (JP)

( * ) Notice: Subject to any disclaimer, the term of this patent is extended or adjusted under 35 U.S.C. 154(b) by 0 days.

(21) Appl. No.: 14/589,763

(22) Filed: Jan. 5, 2015

(65) Prior Publication Data

US 2015/0115279 A1    Apr. 30, 2015

Related U.S. Application Data

(63) Continuation of application No. 14/343,363, filed as application No. PCT/JP2012/069710 on Aug. 2, 2012, now Pat. No. 8,951,897.

(30) Foreign Application Priority Data

Sep. 8, 2011    (JP) .................................. 2011-196434

(51) Int. Cl.
| | | |
|---|---|---|
| H01L 21/425 | (2006.01) | |
| H01L 29/24 | (2006.01) | |
| H01L 29/06 | (2006.01) | |
| H01L 29/36 | (2006.01) | |

(52) U.S. Cl.
CPC .............. *H01L 29/24* (2013.01); *H01L 21/425* (2013.01); *H01L 29/0692* (2013.01); *H01L 29/36* (2013.01)

(58) Field of Classification Search
None
See application file for complete search history.

(56) References Cited

U.S. PATENT DOCUMENTS

| | | | |
|---|---|---|---|
| 5,518,938 A | * | 5/1996 | Yang .............................. 438/199 |
| 6,897,560 B2 | | 5/2005 | Ota et al. |
| 7,713,353 B2 | | 5/2010 | Ichinose et al. |
| 7,727,865 B2 | | 6/2010 | Ichinose et al. |
| 2003/0107098 A1 | | 6/2003 | Ota et al. |
| 2004/0007708 A1 | | 1/2004 | Ichinose et al. |
| 2006/0001031 A1 | | 1/2006 | Ichinose et al. |
| 2007/0166967 A1 | | 7/2007 | Ichinose et al. |
| 2008/0070337 A1 | | 3/2008 | Ichinose et al. |
| 2008/0237607 A1 | | 10/2008 | Ichinose et al. |

(Continued)

FOREIGN PATENT DOCUMENTS

| | | |
|---|---|---|
| EP | 1 306 858 A1 | 5/2003 |
| EP | 1 598 450 A2 | 11/2005 |

(Continued)

OTHER PUBLICATIONS

International Search Report dated Oct. 30, 2012 in PCT/JP2012/069710 (English version).
Notice of Allowance dated Oct. 3, 2014 in U.S. Appl. No. 14/343,363.
European partial Search Report dated Mar. 10, 2015.

(Continued)

*Primary Examiner* — Jack Chen
(74) *Attorney, Agent, or Firm* — McGinn IP Law Group, PLLC.

(57) ABSTRACT

A β-Ga2O3-based single crystal, including a first region that has side and bottom surfaces and is controlled so as to have a first donor concentration; and a second region that surrounds the side and bottom surfaces of the first region and is controlled so as to have a second donor concentration lower than the first donor concentration.

15 Claims, 3 Drawing Sheets

(56) References Cited

U.S. PATENT DOCUMENTS

| | | |
|---|---|---|
| 2010/0038652 A1 | 2/2010 | Ichinose et al. |
| 2013/0248902 A1 | 9/2013 | Ichinose et al. |
| 2014/0217405 A1 | 8/2014 | Sasaki et al. |
| 2014/0217469 A1 | 8/2014 | Sasaki et al. |

FOREIGN PATENT DOCUMENTS

| | | | |
|---|---|---|---|
| JP | 2002-093243 | A | 3/2002 |
| JP | 2004-056098 | A | 2/2004 |
| JP | 2005-235961 | A | 9/2005 |
| JP | 4581270 | B2 | 11/2010 |
| WO | WO 2009/034831 | A1 | 3/2009 |

OTHER PUBLICATIONS

Nogales E et al.: "Cathodoluminescence of Rare Earth Implanted $Ga_2O_3$ and $GeO_2$ nanostructures; Cathodoluminescence of Rare Earth Implanted $Ga_2O_3$ and $GeO_2$ nanostructures", Nanotechnology, IOP, Bristol, GB, vol. 22, No. 28, Jun. 7, 2011, p. 285706.

Iwaya K, et al.: "Atomically Resolved Silicon Donor States of I—$Ga_2O_3$," Applied Physics Letters, American Institute of Physics, US, vol. 98, No. 14, Apr. 7, 2011, pp. 142116-142116.

Nogales, E. et al.: "Cathodoluminescence of Rare Earth Implanted $Ga_2O_3$ and $GeO_2$ nanostructures;" Nanotechnology, IOP, Bristol, GB, vol. 22, No. 28, Jun. 7, 2011, p. 285706.

Iwaya, K. et al.: "Atomically Resolved Silicon Donor States of $\beta$-$Ga_2O_3$" Applied Physics Letters, American Institute of Physics, US, vol. 98, No. 14, Apr. 7, 2011, pp. 142116-142116.

* cited by examiner

METHOD FOR CONTROLLING CONCENTRATION OF DONOR IN GA₂O₃-BASED SINGLE CRYSTAL

The present application is a Continuation Application of U.S. patent application Ser. No. 14/343,363, filed on Mar. 6, 2014, which is based on Japanese Application No. 2011-196434 filed on Sep. 8, 2011 and International Application No. PCT/JP2012/069710 filed on Aug. 2, 2012, the entire contents of which are hereby incorporated by reference.

TECHNICAL FIELD

The invention relates to a method for controlling a concentration of a donor in a $Ga_2O_3$-based single crystal and, in particular, to a method for controlling the concentration of a donor in a $Ga_2O_3$-based single crystal using ion implantation process.

BACKGROUND ART

As a conventional method of forming a $Ga_2O_3$ single crystal, a method is known in which a Group IV element such as Si or Sn is added while growing a $Ga_2O_3$ single crystal to impart conductivity to the $Ga_2O_3$ single crystal (see, e.g., PTL 1).

Meanwhile, as another conventional method of forming a $Ga_2O_3$ single crystal, a method is known in which a $\beta$-$Ga_2O_3$ crystal is heteroepitaxially grown on a sapphire substrate while adding an impurity such as Sn to form a $\beta$-$Ga_2O_3$ crystal film having conductivity (see, e.g., PTL 2).

A method in which an impurity ion is introduced into a SiC crystal by ion implantation process is also known (see, e.g., PTL 3).

CITATION LIST

Patent Literature

JP-A 2005-235961
Japanese Patent No. 4083396
Japanese Patent No. 4581270

SUMMARY OF INVENTION

Technical Problem

In the meantime, it is difficult to use the ion implantation process to introduce an impurity into an oxide single crystal such as $Ga_2O_3$ single crystal for the purpose of imparting conductivity. This is because the oxide is likely to be damaged by ion implantation and such damage is difficult to be sufficiently repaired even if annealing treatment is performed after the ion implantation. It is believed that, in the oxide single crystal, oxygen deficiency during the ion implantation increases damage on the crystal.

However, the ion implantation process is advantageous in that, e.g., an impurity concentration can be controlled after forming a base crystal or it is possible to locally introduce an impurity relatively easily.

It is an object of the invention to provide a method for controlling the concentration of a donor in a $Ga_2O_3$-based single crystal using ion implantation process that allows the formation of a highly electrically conductive region in a $Ga_2O_3$-based single crystal.

Solution to Problem

According to one embodiment of the invention, a method for controlling a concentration of a donor in a $Ga_2O_3$-based single crystal as defined in [1] to [5] below is provided so as to achieve the above object.

[1] A method for controlling a concentration of a donor in a $Ga_2O_3$-based single crystal, comprising:
 a step of introducing a Group IV element as a donor impurity into a $Ga_2O_3$-based single crystal by ion implantation process so as to form a donor impurity implantation region having a higher concentration of the Group IV element than the region without implanting the Group IV element in the $Ga_2O_3$-based single crystal; and
 a step of activating the Group IV element present in the donor impurity implantation region by annealing treatment at a temperature not less than 800° C. to form a high-donor-concentration region.

[2] The method for controlling a concentration of a donor in a $Ga_2O_3$-based single crystal according to [1], wherein the annealing treatment is conducted under a condition of not less than 800° C. in a nitrogen atmosphere.

[3] The method for controlling a concentration of a donor in a $Ga_2O_3$-based single crystal according to [1], wherein the annealing treatment is conducted under a condition of not less than 800° C. and not more than 950° C. in an oxygen atmosphere.

[4] The method for controlling a concentration of a donor in a $Ga_2O_3$-based single crystal according to one of [1] to [3], wherein the Group IV element is introduced into a partial region of a surface of the $Ga_2O_3$-based single crystal using a mask formed on the $Ga_2O_3$-based single crystal so as to form the donor impurity implantation region in the partial region of the surface of the $Ga_2O_3$-based single crystal.

[5] The method for controlling a concentration of a donor in a $Ga_2O_3$-based single crystal according to [1], wherein the $Ga_2O_3$-based single crystal comprises a $Ga_2O_3$-based single crystal substrate or a $Ga_2O_3$-based crystal film formed on a supporting substrate.

Advantageous Effects of Invention

According to an embodiment of the invention, a method for controlling the concentration of a donor in a $Ga_2O_3$-based single crystal using ion implantation process can be provided that allows the formation of a highly electrically conductive region in a $Ga_2O_3$-based single crystal.

DESCRIPTION OF EMBODIMENTS

Embodiment

According to the present embodiment, introduction of a donor impurity into a $Ga_2O_3$-based single crystal using the ion implantation process and subsequent annealing treatment performed under predetermined conditions allow a high-donor-concentration region having superior electrical conductivity to be formed in the $Ga_2O_3$-based crystal. Following is an embodiment thereof and a method for controlling the concentration of a donor in a $\beta$-$Ga_2O_3$-based single crystal will be described in detail as an example. It should be noted that the $Ga_2O_3$-based single crystal in the present embodiment is not limited to a $\beta$-$Ga_2O_3$-based single crystal and may be a $Ga_2O_3$-based single crystal having another structure such as $\alpha$-$Ga_2O_3$-based single crystal.

FIGS. 1A to 1D are cross sectional views of a $\beta$-$Ga_2O_3$-based crystal, showing an example of ion implantation process.

Figure 1A:
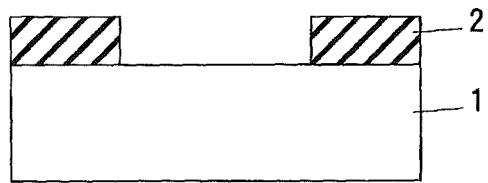
FIG. 1A is a cross sectional view of a $\beta$-$Ga_2O_3$-based crystal, showing an example of ion implantation process.

Firstly, a mask 2 is formed on a $\beta$-$Ga_2O_3$-based single crystal 1, as shown in FIG. 1A.

The mask 2 is formed using a photolithography technique, etc.

Figure 1B:
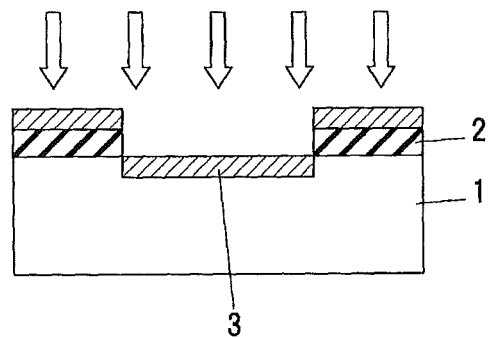
FIG. 1B is a cross sectional view of the $\beta$-$Ga_2O_3$-based crystal, showing the example of ion implantation process.

Next, as shown in FIG. 1B, a donor impurity is implanted into the $\beta$-$Ga_2O_3$-based single crystal 1 by ion implantation and a donor impurity implantation region 3 is thereby formed on a surface of the $\beta$-$Ga_2O_3$-based single crystal 1. At this point, since the donor impurity is not implanted into a region of the $\beta$-$Ga_2O_3$-based single crystal 1 covered with the mask 2, the donor impurity implantation region 3 is formed in a partial region of the surface of the $\beta$-$Ga_2O_3$-based single crystal 1. The donor impurity concentration in the donor impurity implantation region 3 is higher than that of the $\beta$-$Ga_2O_3$-based single crystal 1 in the region with no impurity implanted.

Alternatively, the donor impurity implantation region 3 may be farmed on the entire surface of the $\beta$-$Ga_2O_3$-based single crystal 1 by ion implantation without using the mask 2. In addition, it is possible to control depth or concentration distribution of the donor impurity implantation region 3 by adjusting the ion implantation conditions.

Figure 1C:
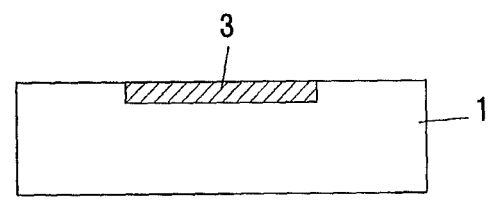
FIG. 1C is a cross sectional view of the $\beta$-$Ga_2O_3$-based crystal, showing the example of ion implantation process.

Next, the mask 2 is removed, as shown in FIG. 1C.

Figure 1D:
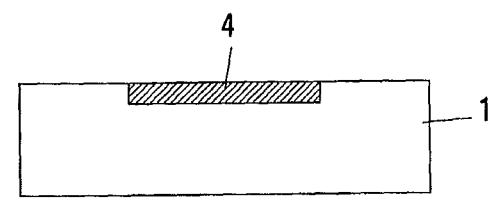
FIG. 1D is a cross sectional view of the $\beta$-$Ga_2O_3$-based crystal, showing the example of ion implantation process.

After that, the donor impurity in the donor impurity implantation region 3 is activated by performing annealing treatment at not less than 800° C., thereby forming a high-donor-concentration region 4 having a high donor concentration, as shown in FIG. 1D. In addition, damage on the $\beta$-$Ga_2O_3$-based single crystal 1 caused by the ion implantation can be repaired by this annealing treatment. In detail, the annealing treatment conditions are, e.g., not less than 800° C. in an inert atmosphere such as nitrogen atmosphere or argon atmosphere, or not less than 800° C. and not more than 950° C. in an oxygen atmosphere.

The $\beta$-$Ga_2O_3$-based single crystal 1 is constructed from a $\beta$-$Ga_2O_3$ single crystal or a $\beta$-$Ga_2O_3$ single crystal doped with elements such as Al and In. It may be, e.g., a $(Ga_xAl_yIn_{(1-x-y)})_2O_3$ ($0<x\leq1$, $0\leq y\leq1$, $0<x+y\leq1$) crystal which is a $\beta$-$Ga_2O_3$ crystal doped with Al and In. The band gap is widened by adding Al and is narrowed by adding In.

The $\beta$-$Ga_2O_3$-based single crystal 1 is a $\beta$-$Ga_2O_3$-based single crystal substrate or a $\beta$-$Ga_2O_3$-based crystal film formed on a supporting substrate.

Group IV elements such as Si, Sn and Ge are used as a donor impurity to be introduced into the $\beta$-$Ga_2O_3$-based single crystal 1 by the ion implantation process.

Figure 2:
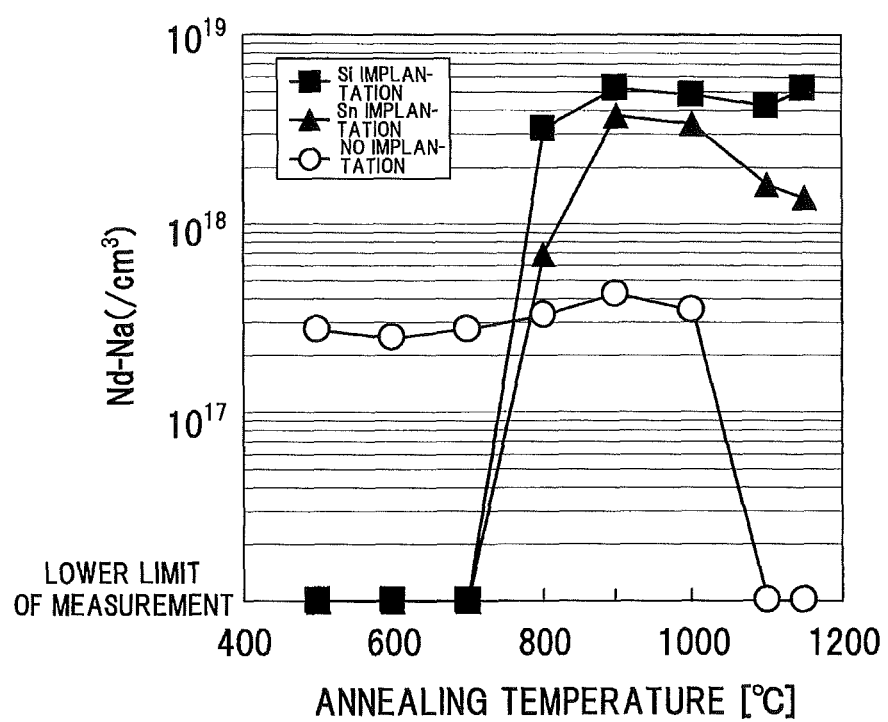
FIG. 2 is a graph showing a relation between annealing treatment temperature in a nitrogen atmosphere after ion implantation and conductivity of a $\beta$-$Ga_2O_3$ crystal film.

FIG. 2 is a graph showing a relation between annealing treatment temperature in a nitrogen atmosphere after ion implantation and conductivity of the $\beta$-$Ga_2O_3$ single crystal substrate as the $\beta$-$Ga_2O_3$-based single crystal. The vertical axis in FIG. 2 indicates a difference between donor density and acceptor density (Nd—Na) per unit cubic centimeter in the high-donor-concentration region of the $\beta$-$Ga_2O_3$ single crystal substrate, i.e., indicates a conductivity level of the high-donor-concentration region of the $\beta$-$Ga_2O_3$ single crystal substrate which is an n-type semiconductor. The horizontal axis in FIG. 2 indicates annealing treatment temperature in a nitrogen atmosphere. The annealing treatment is performed for 30 minutes each.

The high-donor-concentration region is a box-shaped region having a depth of 200 nm and is formed by ion-implanting Si or Sn with a concentration of $1\times10^{19}/cm^3$ into a $\beta$-$Ga_2O_3$ single crystal substrate having a donor concentration of $3\times10^{17}/cm^3$. In addition, the high-donor-concentration region is formed by vertically implanting a donor impurity on a (010) plane, as a main surface, of the $\beta$-$Ga_2O_3$ single crystal substrate.

The filled square and the filled triangle in FIG. 2 indicate Nd—Na values when respectively implanting Si and Sn as a donor impurity. Meanwhile, the open circle indicates Nd—Na values when the donor impurity is not implanted.

As shown in FIG. 2, the Nd—Na value is increased by annealing treatment at not less than 800° C. in case of implanting Si as well as in case of implanting Sn. That is, the annealing treatment at not less than 800° C. in a nitrogen atmosphere after the ion implantation allows high conductivity to be imparted to the $\beta$-$Ga_2O_3$ single crystal substrate. It should be noted that, when the donor impurity is not implanted, the Nd—Na value is not greatly increased even if the annealing treatment temperature is raised.

Figure 3:
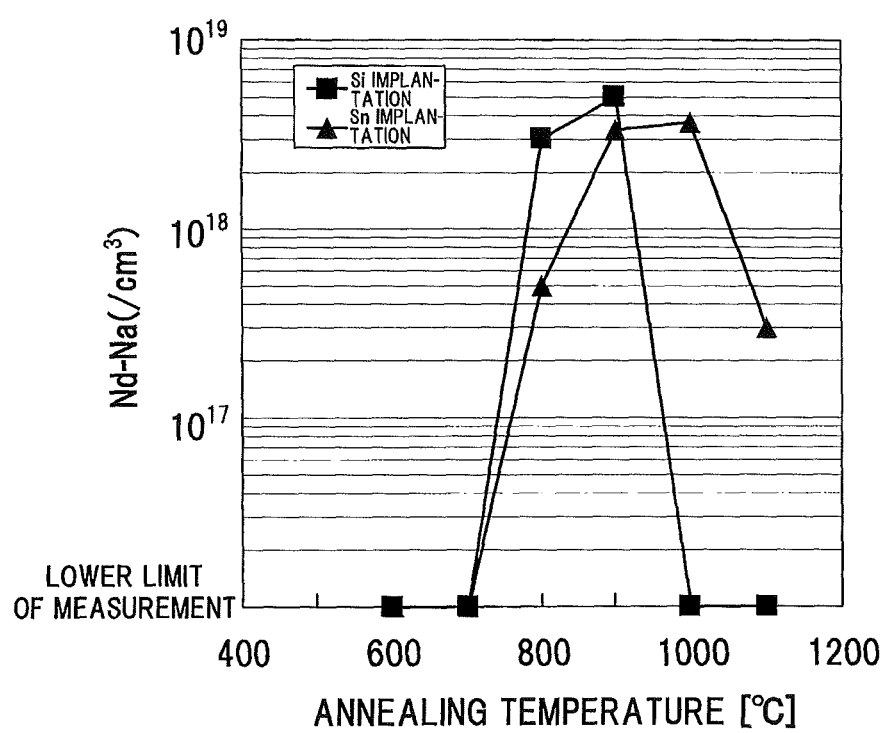
FIG. 3 is a graph showing a relation between annealing treatment temperature in an oxygen atmosphere after ion implantation and conductivity of a $\beta$-$Ga_2O_3$ crystal film.

FIG. 3 is a graph showing a relation between annealing treatment temperature in an oxygen atmosphere after ion implantation and conductivity of the $\beta$-$Ga_2O_3$ single crystal substrate as the $\beta$-$Ga_2O_3$-based single crystal. The vertical axis in FIG. 3 indicates a difference between donor density and acceptor density (Nd—Na) per unit cubic centimeter in the high-donor-concentration region of the $\beta$-$Ga_2O_3$ single crystal substrate, i.e., indicates a conductivity level of the high-donor-concentration region of the $\beta$-$Ga_2O_3$ single crystal substrate which is an n-type semiconductor. The horizontal axis in FIG. 3 indicates annealing treatment temperature in an oxygen atmosphere. The annealing treatment is performed for 30 minutes each.

The filled square and the filled triangle in FIG. 3 indicate the Nd—Na values when respectively implanting Si and Sn as a donor impurity.

As shown in FIG. 3, the Nd—Na value is increased by annealing treatment at not less than 800° C. and not more than 950° C. when Si is implanted. Also, the Nd—Na value is increased by annealing treatment at not less than 800° C. and not more than 1100° C. when Sn is implanted. That is, the annealing treatment at not less than 800° C. and not more than 950° C. in an oxygen atmosphere after the ion implantation allows high conductivity to be imparted to the $\beta$-$Ga_2O_3$ single crystal substrate.

Effects of the Embodiment

According to the present embodiment, introduction of a donor impurity into a $\beta$-$Ga_2O_3$-based crystal using the ion implantation process and subsequent annealing treatment performed under predetermined conditions allow a high-donor-concentration region having superior electrical conductivity to be formed in the β-Ga$_2$O$_3$-based crystal. Since the high-donor-concentration region is formed using the ion implantation process, it is possible to control the donor concentration in the high-donor-concentration region after forming the β-Ga$_2$O$_3$-based crystal and thereby to impart a desired conductivity. In addition, use of a mask, etc., allows the high-donor-concentration region to be locally formed in the β-Ga$_2$O$_3$-based crystal.

Although the embodiment the invention has been described above, the invention according to claims is not to be limited to the above-mentioned embodiment. Further, it should be noted that all combinations of the features described in the embodiment are not necessary to solve the problem of the invention.

INDUSTRIAL APPLICABILITY

A method for controlling the concentration of a donor in a Ga$_2$O$_3$-based single crystal using ion implantation process, which allows a highly electrically conductive region to be formed in a Ga$_2$O$_3$-based single crystal, is provided.

REFERENCE SIGNS LIST

1: β-Ga$_2$O$_3$-based single crystal
2: mask
3: donor impurity implantation region
4: high-donor-concentration region

What is claimed is:

1. A β-Ga$_2$O$_3$-based single crystal, comprising:
a first region that includes side and bottom surfaces and is controlled so as to have a first donor concentration; and
a second region that surrounds the side and bottom surfaces of the first region and is controlled so as to have a second donor concentration lower than the first donor concentration,
wherein a donor impurity included in the first region is selected from group IV elements, and
wherein the first donor concentration is increased by activation of the donor impurity in the first region.

2. The β-Ga$_2$O$_3$-based single crystal according to claim 1, wherein the donor impurity is selected from a group consisting of Sn, Si, and Ge.

3. The β-Ga$_2$O$_3$-based single crystal according to claim 1, wherein the β-Ga$_2$O$_3$-based single crystal is cubic.

4. The β-Ga$_2$O$_3$-based single crystal according to claim 3, wherein the first region comprises a region formed on all surfaces of the cubic single crystal.

5. The β-Ga$_2$O$_3$-based single crystal according to claim 4, wherein the second region comprises a remaining region of the cubic single crystal.

6. The β-Ga$_2$O$_3$-based single crystal according to claim 1, wherein the donor impurity is ion implanted in the β-Ga$_2$O$_3$-based single crystal.

7. The β-Ga$_2$O$_3$-based single crystal according to claim 1, wherein the β-Ga$_2$O$_3$-based single crystal comprises a β-Ga$_2$O$_3$-based single crystal substrate.

8. The β-Ga$_2$O$_3$-based single crystal according to claim 1, wherein the β-Ga$_2$O$_3$-based single crystal comprises a β-Ga$_2$O$_3$-based crystal film formed on a supporting substrate.

9. A β-Ga$_2$O$_3$-based single crystal material, comprising:
a first region with a first donor concentration, the first region having a shape in a controlled plan view and a controlled depth of the first region that are controlled; and
a second region with a second donor concentration lower than the first donor concentration, the second region comprising a controlled interface in contact with the first region,
wherein a donor impurity included in the first region is selected from group IV elements, and
wherein the donor impurity in the first region comprises an activated donor impurity.

10. The β-Ga$_2$O$_3$-based single crystal material according to claim 9, wherein the first region comprises a box-shaped region, and the second region comprises a region having a concave interface in contact with side and bottom surfaces of the box-shaped region.

11. The β-Ga$_2$O$_3$-based single crystal material according to claim 4, wherein the β-Ga$_2$O$_3$-based single crystal material is formed to be cubic, the first region comprises a region formed on all surfaces of the cubic single crystal material to a predetermined depth, and the second region comprises a remaining region of the cubic single crystal material.

12. The β-Ga$_2$O$_3$-based single crystal material according to claim 9, wherein the donor impurity is selected from a group consisting of Sn, Si, and Ge.

13. The β-Ga$_2$O$_3$-based single crystal material according to claim 9, wherein the β-Ga$_2$O$_3$-based single crystal material is cubic.

14. The β-Ga$_2$O$_3$-based single crystal material according to claim 13, wherein the first region comprises a region formed on all surfaces of the cubic single crystal material.

15. The β-Ga$_2$O$_3$-based single crystal material according to claim 14, wherein the second region comprises a remaining region of the cubic single crystal material.

* * * * *